United States Patent
Wallace et al.

(10) Patent No.: US 6,947,332 B2
(45) Date of Patent: Sep. 20, 2005

(54) COMPUTER MEMORY CARDS USING FLASH EEPROM INTEGRATED CIRCUIT CHIPS AND MEMORY-CONTROLLER SYSTEMS

(75) Inventors: Robert F. Wallace, Sunnyvale, CA (US); Robert D. Norman, San Jose, CA (US); Eliyahou Harari, Los Gatos, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/628,746

(22) Filed: Jul. 28, 2003

(65) Prior Publication Data

US 2004/0017707 A1 Jan. 29, 2004

Related U.S. Application Data

(63) Continuation of application No. 10/197,027, filed on Jul. 16, 2002, now Pat. No. 6,628,537, which is a continuation of application No. 09/888,167, filed on Jun. 22, 2001, now Pat. No. 6,434,034, which is a continuation of application No. 09/473,848, filed on Dec. 28, 1999, now Pat. No. 6,252,791, which is a division of application No. 09/121,348, filed on Jul. 23, 1998, now Pat. No. 6,011,741, which is a continuation of application No. 08/907,111, filed on Aug. 6, 1997, now Pat. No. 5,867,417, which is a continuation of application No. 08/527,254, filed on Sep. 12, 1995, now Pat. No. 5,663,901, which is a continuation of application No. 07/736,732, filed on Jul. 26, 1991, now abandoned, which is a continuation-in-part of application No. 07/684,034, filed on Apr. 11, 1991, now abandoned.

(51) Int. Cl.[7] .............................................. G11C 16/04
(52) U.S. Cl. ..................................... 365/185.33; 365/52
(58) Field of Search ........................ 365/52, 63, 185.33

(56) References Cited

U.S. PATENT DOCUMENTS

| 4,210,959 A | 7/1980 | Wozniak |
| 4,218,742 A | 8/1980 | Carlton et al. |
| 4,270,184 A | 5/1981 | Shimokawa |
| 4,287,570 A | 9/1981 | Stark |
| 4,295,205 A | 10/1981 | Kunstadt |
| 4,347,587 A | 8/1982 | Rao |
| 4,398,248 A | 8/1983 | Hsia et al. |
| 4,442,504 A | 4/1984 | Dummermuth et al. |

(Continued)

FOREIGN PATENT DOCUMENTS

| AU | 0557723 | 6/1984 |
| EP | 0220718 | 5/1986 |
| EP | 0 214 478 A3 | 3/1987 |

(Continued)

OTHER PUBLICATIONS

"PC Card Standard: Release 1.0", Personal Computer Memory Card International Association, pp. 1–102, Aug. 8, 1990.
Brochure: "Wafer–Stack Wafer–Scale Storage Subsystem," Anamartic, Inc., 1990.
Auclair, D.L., "Optimal solid State Disk Architecture for Portable Computers", *Silicon Valley PC Design Conference* (*SVPC*), pp. 811–815, Jul. 9–10, 1991.

(Continued)

*Primary Examiner*—Son Mai
(74) *Attorney, Agent, or Firm*—Parsons Hsue & de Runtz LLP

(57) ABSTRACT

A very small computer memory card is densely packed with a large number of flash EEPROM integrated circuit chips. A computer memory system provides for the ability to removably connect one or more of such cards with a common controller circuit that interfaces between the memory cards and a standard computer system bus. Alternately, each card can be provided with the necessary controller circuitry and thus is connectable directly to the computer system bus. An electronic system is described for a memory system and its controller within a single memory card. In a preferred physical arrangement, the cards utilize a main circuit board with a plurality of sub-boards attached thereto on both sides, each sub-board carrying several integrated circuit chips.

24 Claims, 11 Drawing Sheets

U.S. PATENT DOCUMENTS

| | | | |
|---|---|---|---|
| 4,443,845 A | 4/1984 | Hamilton et al. | |
| 4,456,971 A | 6/1984 | Fukuda et al. | |
| 4,504,927 A | 3/1985 | Callan | |
| 4,509,113 A | 4/1985 | Heath | |
| 4,545,010 A | 10/1985 | Salas et al. | |
| 4,617,624 A | 10/1986 | Goodman | |
| 4,642,759 A | 2/1987 | Foster | |
| 4,654,829 A | 3/1987 | Jiang et al. | |
| 4,703,420 A | 10/1987 | Irwin | |
| 4,744,764 A | 5/1988 | Rubenstein | |
| 4,780,855 A | 10/1988 | Iida et al. | |
| 4,785,425 A | 11/1988 | Lavelle | |
| 4,797,543 A | 1/1989 | Watanabe | |
| 4,798,941 A | 1/1989 | Watanabe | |
| 4,800,520 A | 1/1989 | Iijima | |
| 4,803,554 A | 2/1989 | Pape | |
| 4,829,169 A | 5/1989 | Watanabe | |
| 4,831,245 A | 5/1989 | Ogasawara | |
| 4,853,522 A | 8/1989 | Ogasawara | |
| 4,855,842 A | 8/1989 | Hayes et al. | |
| 4,882,702 A | 11/1989 | Struger et al. | |
| 4,887,234 A | 12/1989 | Iijima | |
| 4,890,832 A | 1/1990 | Komaki | |
| 4,891,506 A | 1/1990 | Yoshimatsu | |
| 4,896,262 A | 1/1990 | Wayama et al. | |
| 4,937,419 A | 6/1990 | Kolodziej et al. | |
| 4,942,453 A | 7/1990 | Ishida et al. | |
| 4,949,240 A | 8/1990 | Iijima | |
| 4,958,315 A | 9/1990 | Balch | |
| 4,980,856 A | 12/1990 | Ueno | |
| 4,982,378 A * | 1/1991 | Matsushita | 365/189.01 |
| 4,985,920 A | 1/1991 | Seki | |
| 4,989,181 A | 1/1991 | Harada | |
| 4,992,651 A | 2/1991 | Takahira | |
| 5,033,021 A | 7/1991 | Barakat | |
| 5,033,027 A | 7/1991 | Amin | |
| 5,036,429 A | 7/1991 | Kaneda et al. | |
| 5,036,481 A | 7/1991 | Lunsford et al. | |
| 5,038,025 A | 8/1991 | Kodera | |
| 5,043,940 A | 8/1991 | Harari | |
| 5,056,001 A | 10/1991 | Sexton | |
| 5,070,474 A | 12/1991 | Tuma et al. | |
| 5,099,394 A | 3/1992 | Hood et al. | |
| 5,119,338 A | 6/1992 | Saito | |
| 5,121,500 A | 6/1992 | Arlington et al. | |
| 5,127,097 A | 6/1992 | Mizuta | |
| 5,172,338 A | 12/1992 | Mehrotra et al. | |
| 5,184,282 A | 2/1993 | Kaneda et al. | |
| 5,200,959 A | 4/1993 | Gross et al. | |
| 5,218,569 A | 6/1993 | Banks | |
| 5,226,136 A | 7/1993 | Nakagawa | |
| 5,226,168 A * | 7/1993 | Kobayashi et al. | 703/25 |
| 5,251,302 A | 10/1993 | Weigl et al. | |
| 5,289,413 A | 2/1994 | Tsuchida et al. | |
| 5,291,584 A | 3/1994 | Challa et al. | |
| 5,297,148 A * | 3/1994 | Harari et al. | 714/710 |
| 5,297,272 A | 3/1994 | Lu et al. | |
| 5,303,198 A * | 4/1994 | Adachi et al. | 365/185.11 |
| 5,307,463 A | 4/1994 | Hyatt et al. | |
| 5,371,736 A | 12/1994 | Evan | |
| 5,375,084 A | 12/1994 | Begun et al. | |
| 5,418,752 A | 5/1995 | Harari et al. | |
| 5,430,859 A | 7/1995 | Norman et al. | |
| 5,455,911 A | 10/1995 | Johansson | |
| 5,457,590 A | 10/1995 | Barrett et al. | |
| 5,485,590 A | 1/1996 | Hyatt et al. | |
| 5,602,987 A | 2/1997 | Harari et al. | |
| 5,659,705 A | 8/1997 | McNutt et al. | |
| 5,663,901 A | 9/1997 | Wallace et al. | |
| 5,867,417 A | 2/1999 | Wallace et al. | |
| 6,011,741 A | 1/2000 | Wallace et al. | |

FOREIGN PATENT DOCUMENTS

| | | |
|---|---|---|
| EP | 0 228 278 A2 | 7/1987 |
| EP | 0 385 750 B1 | 9/1990 |
| EP | 0392895 | 10/1990 |
| EP | 0 406 610 A2 | 1/1991 |
| GB | 2093236 A | 8/1982 |
| GB | 2172126 A | 9/1986 |
| GB | 2202349 A | 9/1988 |
| JP | 2683348 | 8/1997 |
| WO | WO9012400 | 10/1990 |

OTHER PUBLICATIONS

Miller, "Semidisk Disk Emulator," *Interface Age*, p. 102, Nov., 1982.

Clewitt, "Bubble Memories as a Floppy Disk Replacement," *1978 MIDCON Technical Papers*, vol. 2, pp. 1–7, Dec. 1978.

Hancock, Architecting a CCD Replacement for the IBM 2305 Fixed Head Disk Drive, Digest of Papers, *Eighteenth IEEE Computer Society International Conference*, pp. 182–184, 1979.

Bleiker and Melchior, "A Four–State EEPROM Using Floating–Gate Memory Cells", *IEEE Journal of Solid–State Circuits*, vol. SC22, No. 3, Jun. 1987, New York, NY, USA.

"CL–SH265 Advance Data Sheet," *Cirrus Logic, Inc.*, pp. 1–83, (Dec., 1990).

Cormier, "Special Report—Erasable/Programmable Solid–State Memories," Electrical Design News, vol. 30, No. 25, pps. 144–154 (Nov. 14, 1985).

Lai, R., and The Waite Group, Inc., *Writing MS–DOS Device Drivers*, "Chapter 7—Introducing Disk Internals," pps. 237–273 (1987) and "Chapter 8—A RAM Disk Device Driver," pps. 277–319 (1987).

Office Action mailed Mar. 16, 1994 in Application No. 07/736,732, including copies of pending claims.

Office Action mailed Oct. 3, 1994 in Application No. 07/736,732, including copies of pending claims.

Office Action mailed Oct. 19, 2001 in Application No. 09/888,167, including copies of pending claims.

* cited by examiner

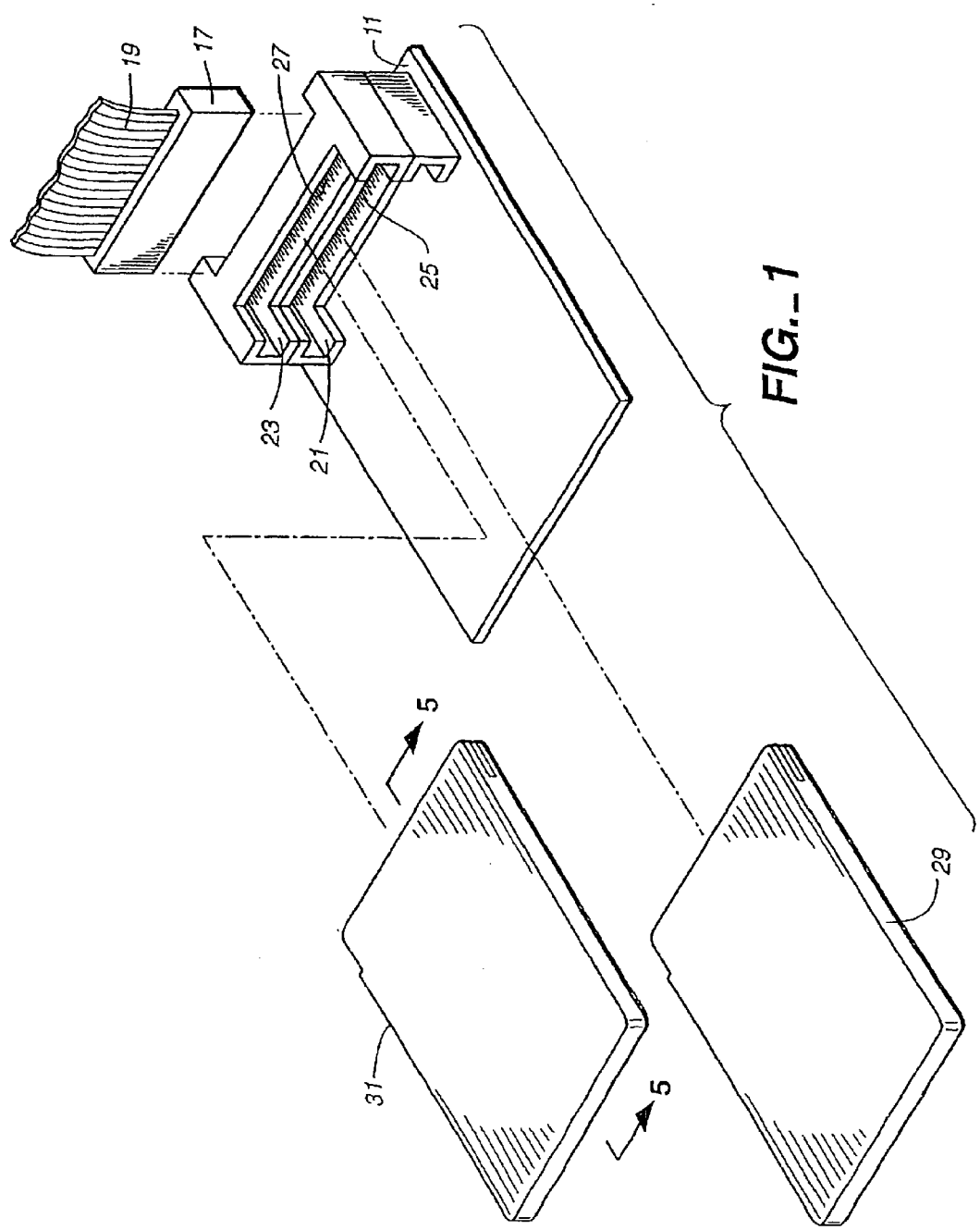

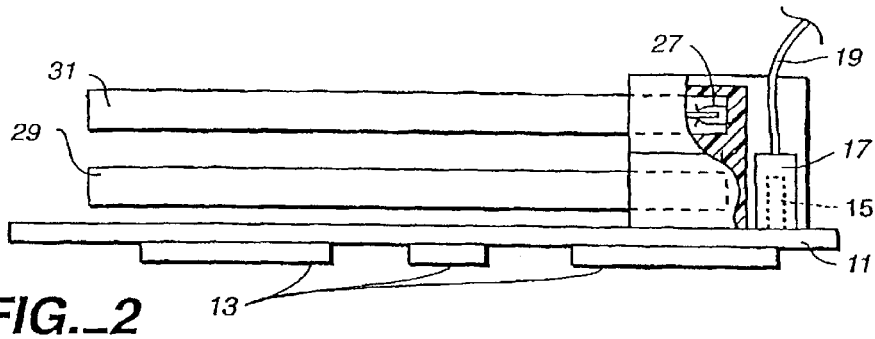
FIG._2
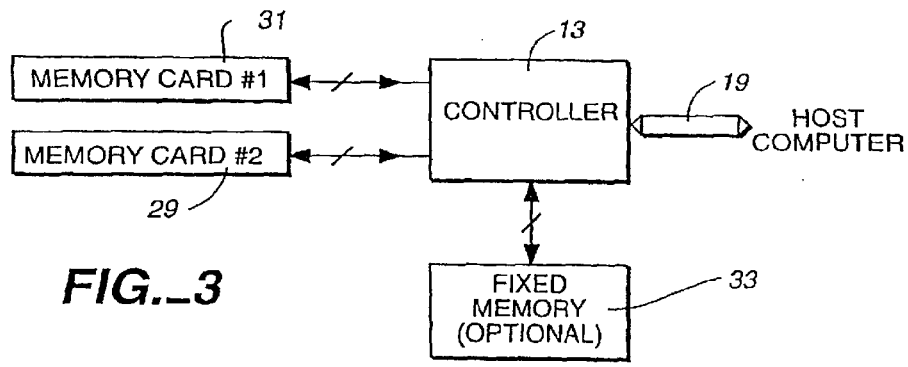
FIG._3
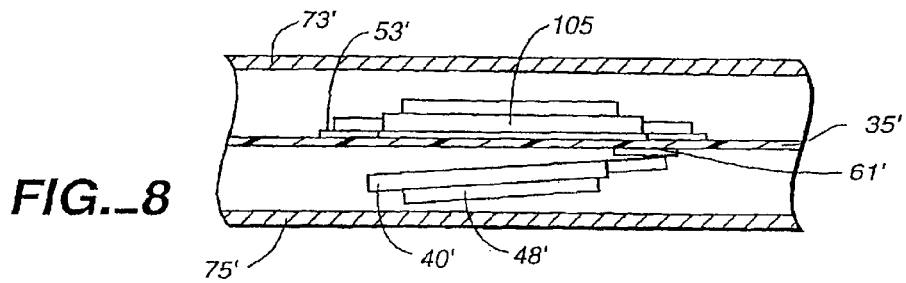
FIG._8
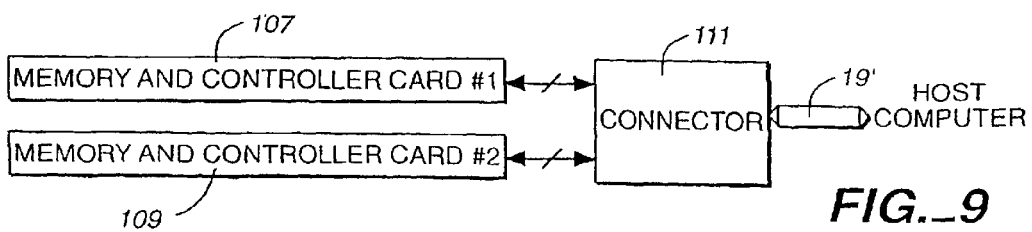
FIG._9

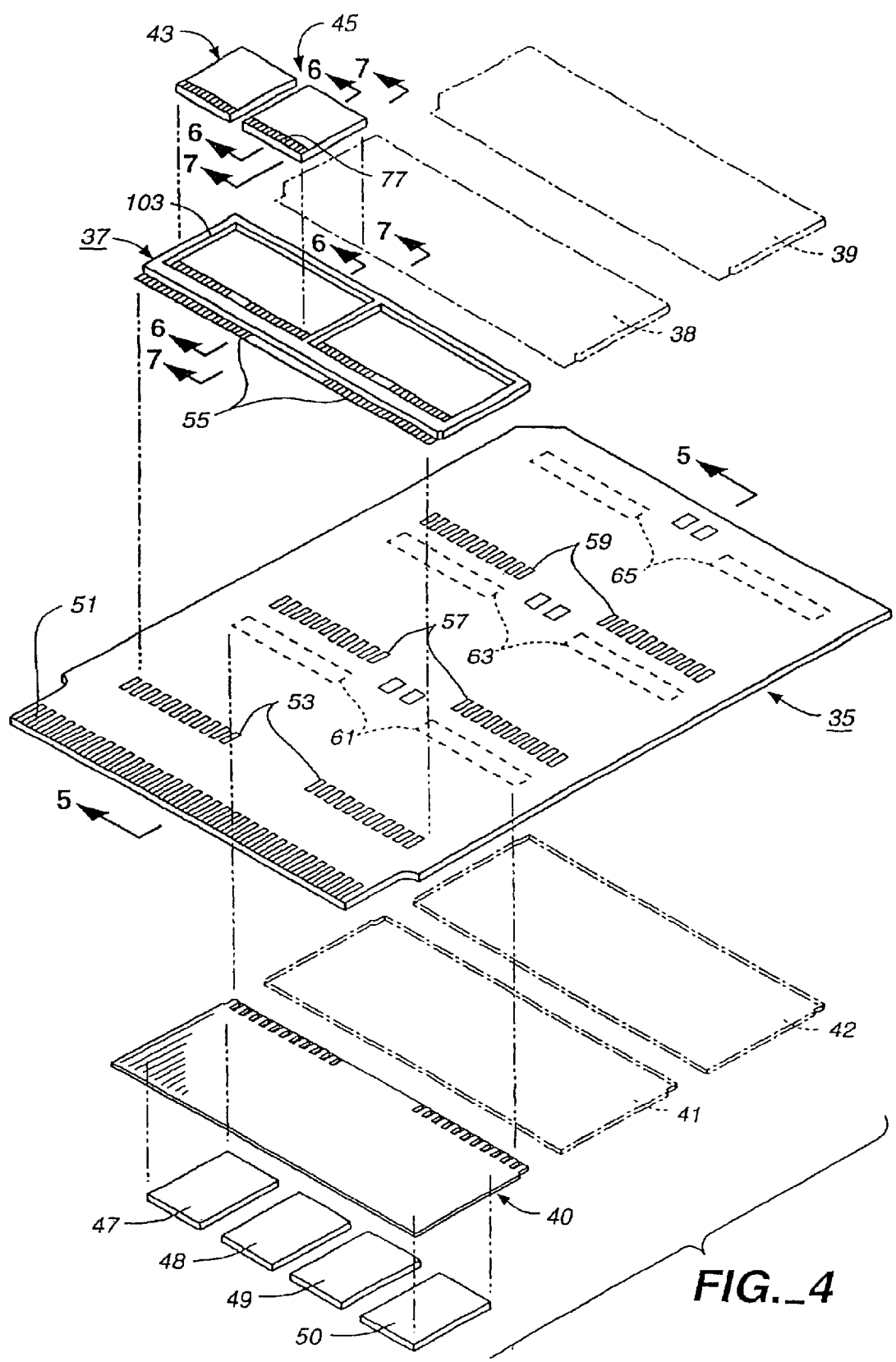
FIG._4

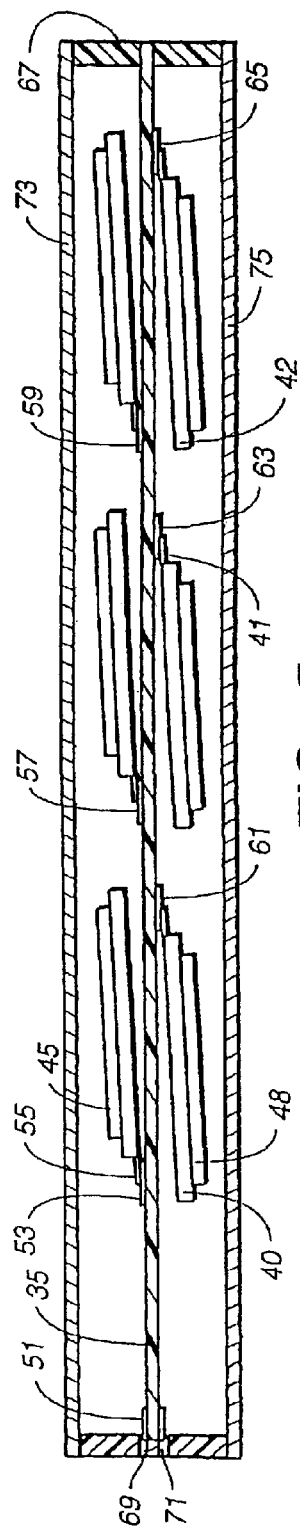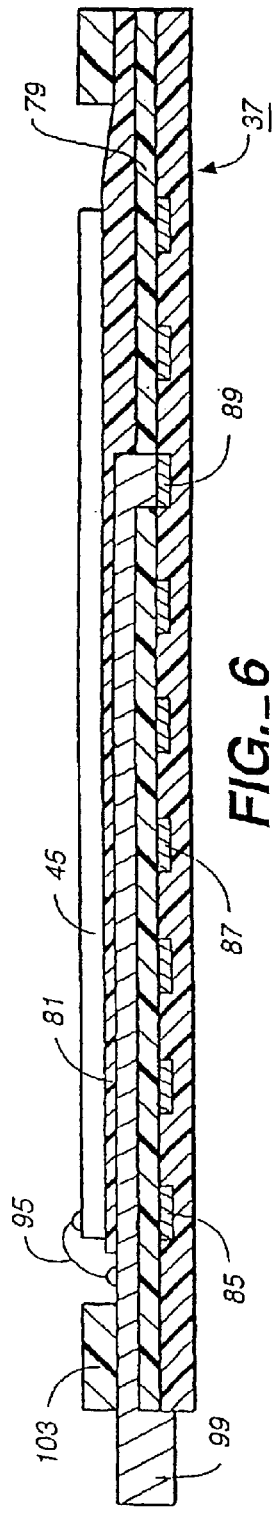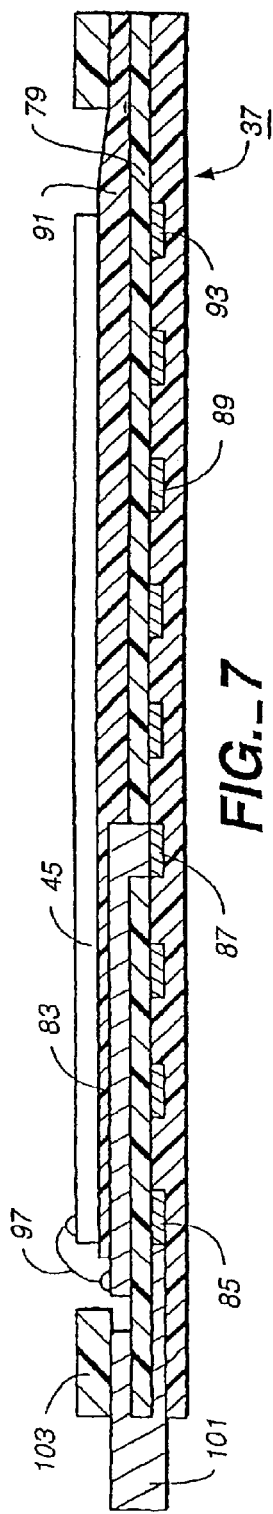

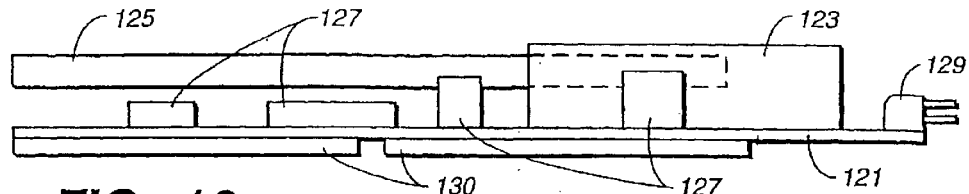
FIG._10
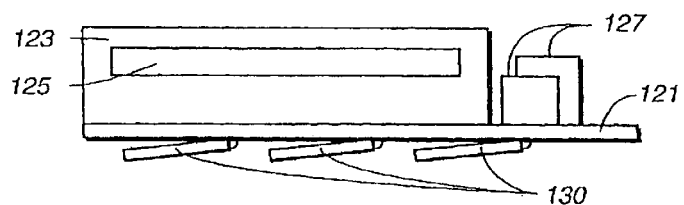
FIG._11
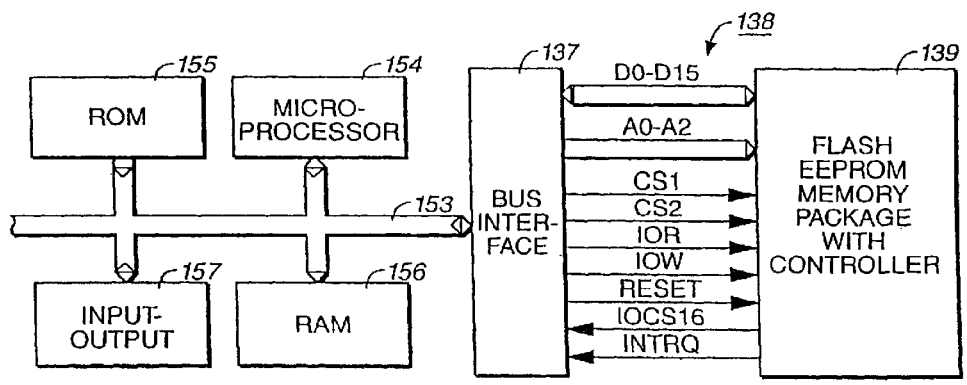
FIG._12
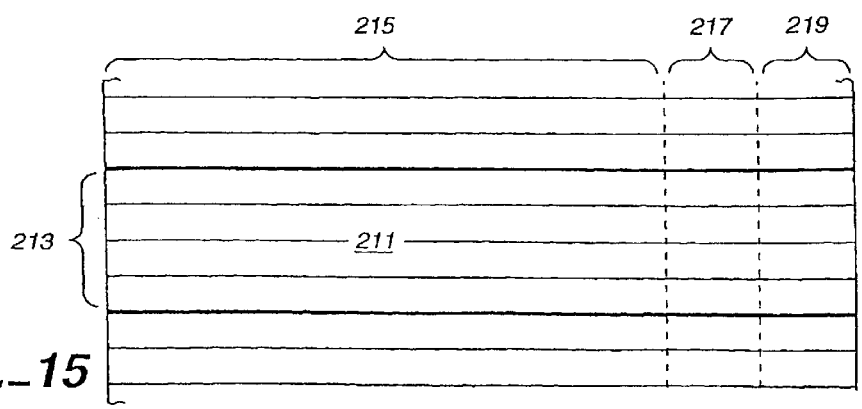
FIG._15

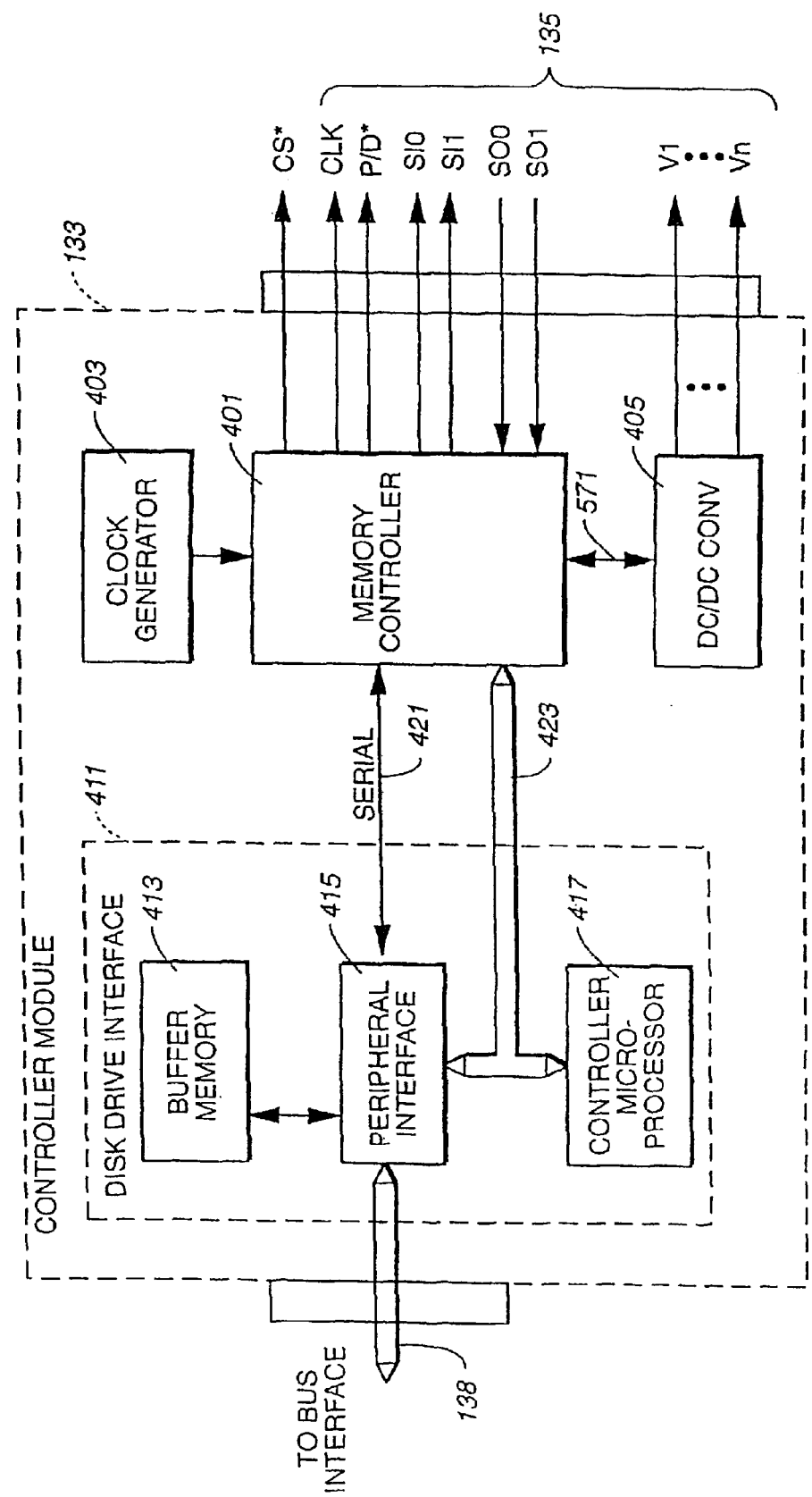
FIG._13A

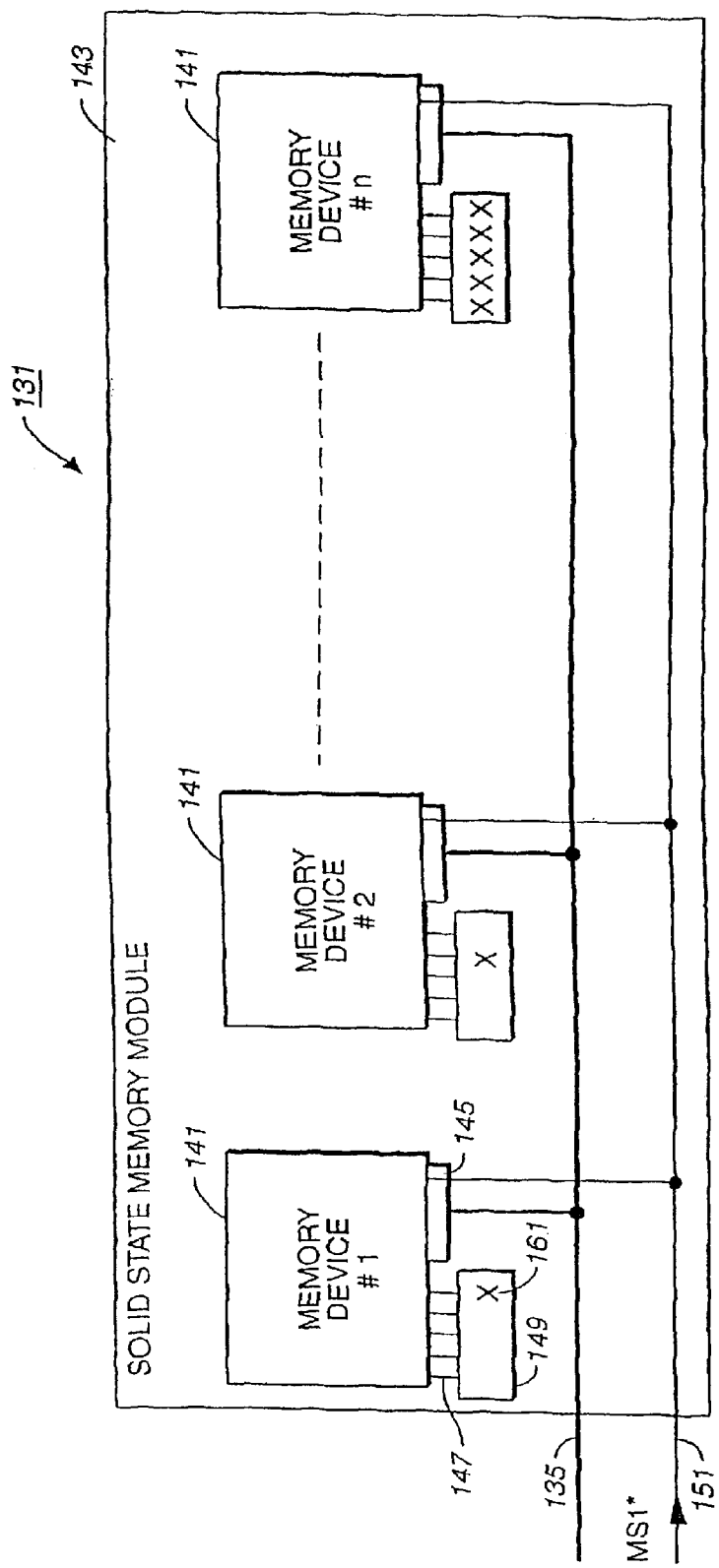
FIG._13B

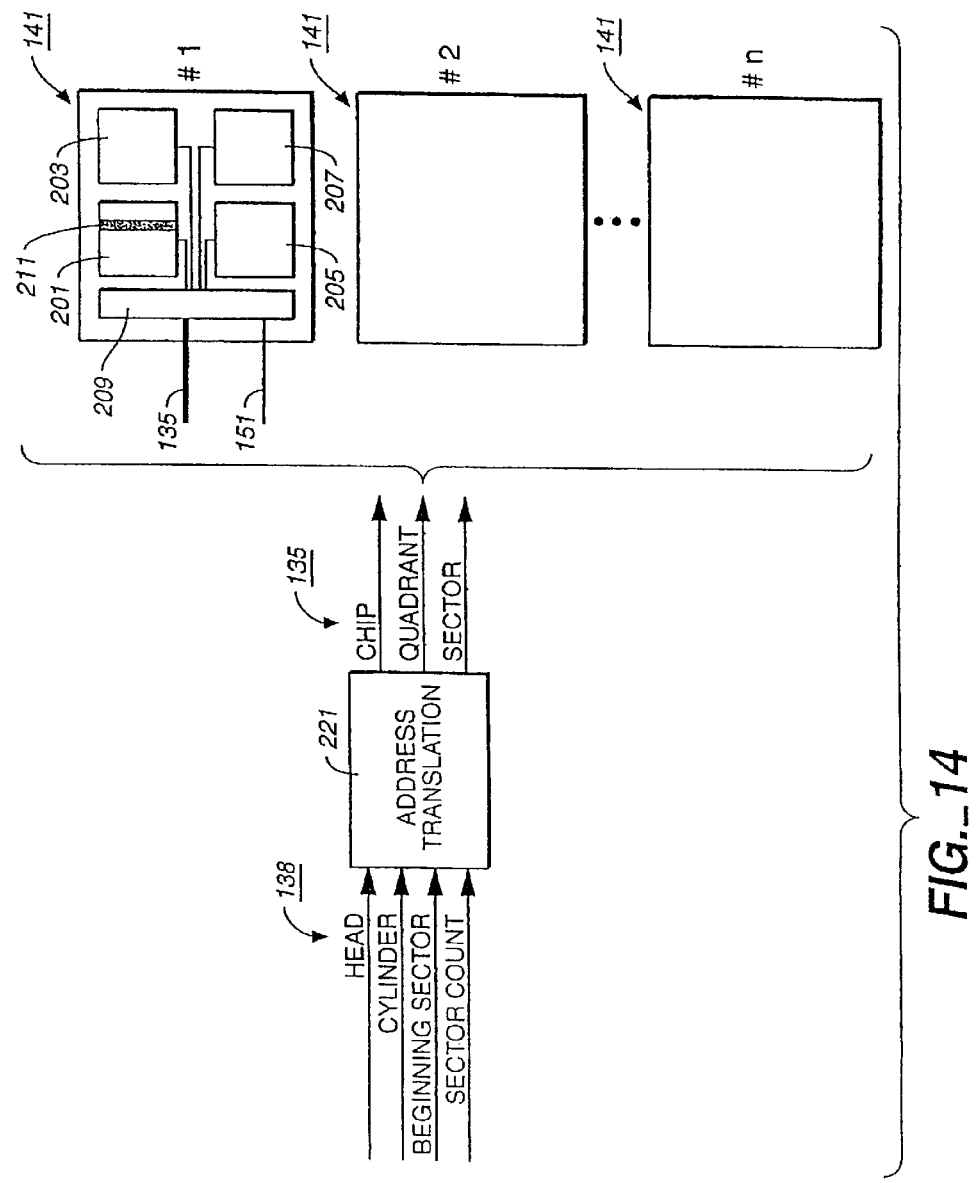

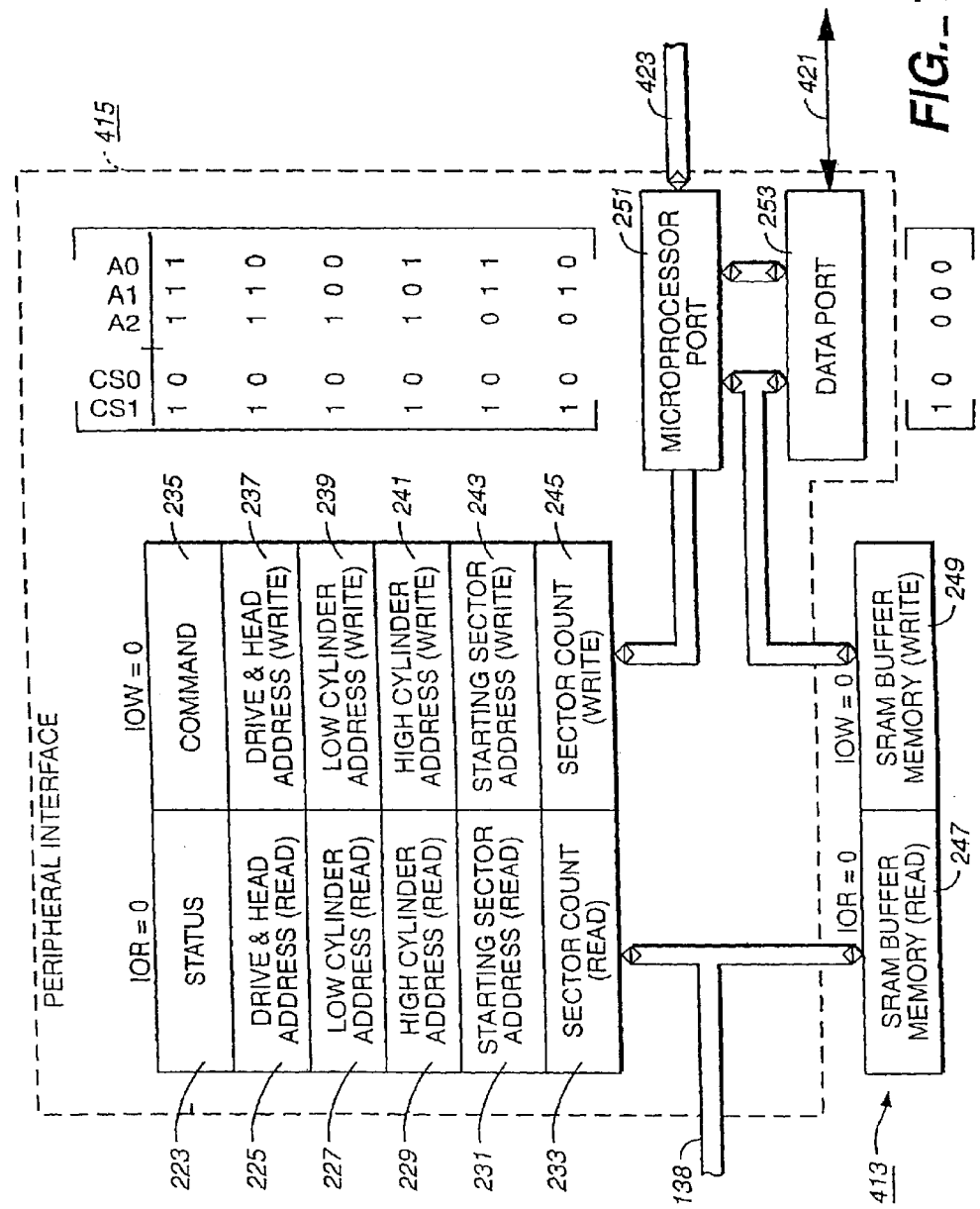
FIG._16

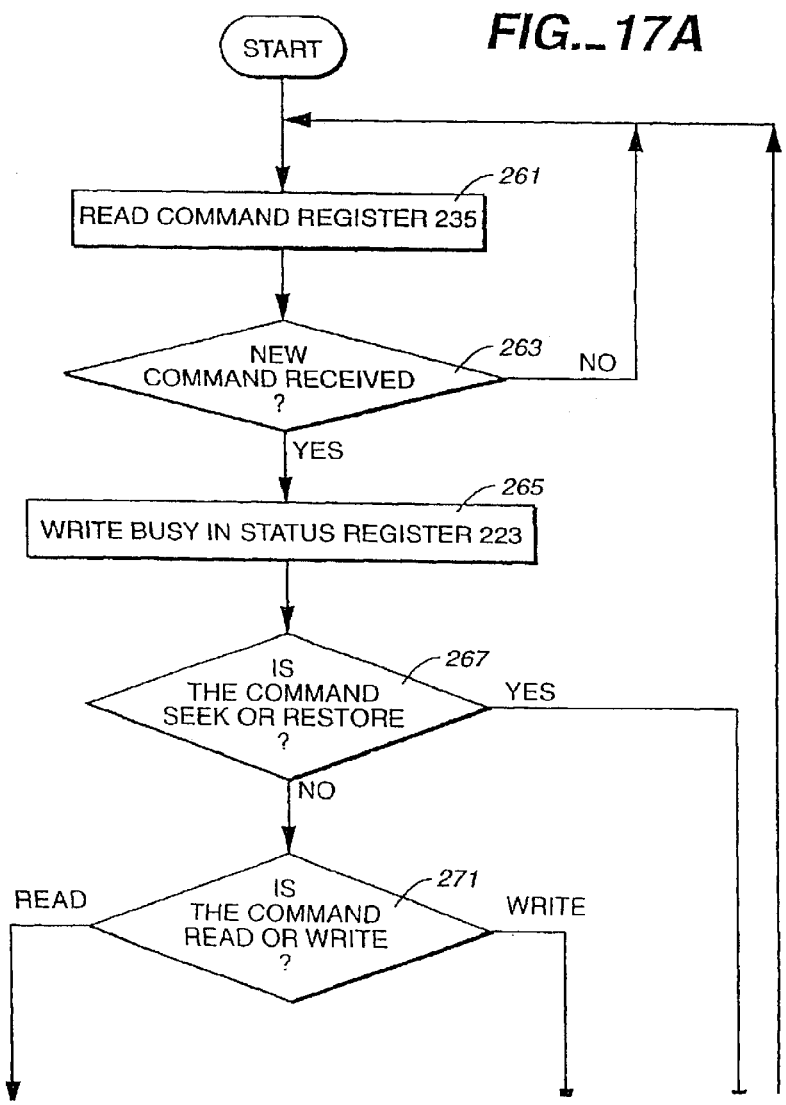

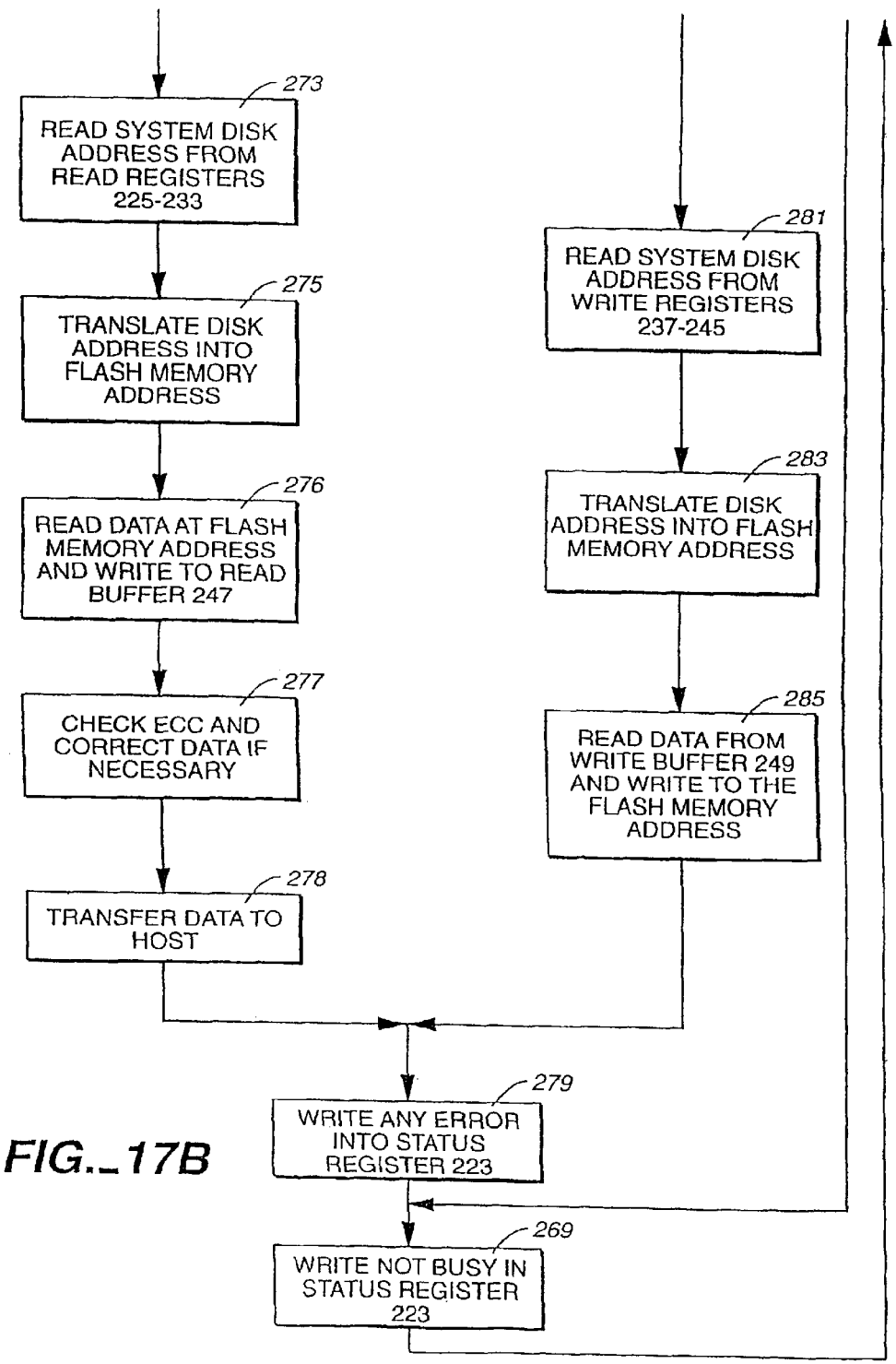
FIG._17B

COMPUTER MEMORY CARDS USING FLASH EEPROM INTEGRATED CIRCUIT CHIPS AND MEMORY-CONTROLLER SYSTEMS

CROSS-REFERENCE TO RELATED APPLICATIONS

This is a continuation of application Ser. No. 10/197,027, filed Jul. 16, 2002 now U.S. Pat. No. 6,628,637, which is a continuation of application Ser. No. 09/888,167, filed Jun. 22, 2001, now U.S. Pat. No. 6,434,034, which is a continuation of application Ser. No. 09/473,848, filed Dec. 28, 1999, now U.S. Pat. No. 6,252,791, which is a division of application Ser. No. 09/121,348, filed Jul. 23, 1998, now U.S. Pat. No. 6,011,741, which is a continuation of application Ser. No. 08/907,111, filed Aug. 6, 1997, now U.S. Pat. No. 5,867,417, which is a continuation of application Ser. No. 08/527,254, filed Sep. 12, 1995, now U.S. Pat. No. 5,663,901, which is a continuation of application Ser. No. 07/736,732, filed Jul. 26, 1991, now abandoned, which is a continuation-in-part of application Ser. No. 07/684,034, filed Apr. 11, 1999 now abandoned, all of which are hereby incorporated herein by this reference.

This is also related to another patent application filed concurrently with a parent application, entitled "Device and Method for Controlling Solid-State Memory System", naming Robert D. Norman, Karl M. J. Lofgren, Jeffrey D. Stai, Anil Gupta and Sanjay Mehrotra as inventors, Ser. No. 07/736,733, now U.S. Pat. No. 5,430,859, the disclosure of which is incorporated herein by this reference.

BACKGROUND OF THE INVENTION

This invention is related to computer memory systems of a type utilizing small, compact semiconductor memory cards, and particularly to a structure within the cards for densely packing a large number of integrated circuit chips of electrically erasable and programmable read-only-memory ("EEPROM") to provide a complete memory system.

Currently, standard microcomputer systems use a combination of fixed and removable (floppy) magnetic disk media for long-term, non-volatile memory. Semiconductor random access memory ("RAM") without a battery power supply backup is only temporarily used since it is volatile; that is, when power to the computer system is disconnected, contents of the RAM are lost. A small amount of read only memory ("ROM") is also included for permanent storage of certain computer system parameters that do not change.

There is currently underway an effort to develop non-volatile flash EEPROM memory systems to replace either of the existing fixed or floppy magnetic disk systems, or both. It is now becoming possible to form a megabyte or more of flash EEPROM on a single semiconductor integrated circuit chip. As a result, several megabytes of memory can be formed in a very small package.

Indeed, an industry "PC Card Standard", release 1.0, dated August 1990, of the Personal Computer Memory Card International Association (PCMCIA) sets mechanical and electrical interface standards for a memory card that is not much larger than an ordinary credit card. Although some physical dimension variations are permitted within the scope of this standard, it is less than 6.0 mm in overall outside thickness, less than 5.5 cm in width, and less than 9.0 cm in length. A female type of pin connector is provided across one of the narrow ends of the card structure. Such PC cards have been commercially implemented primarily with static random-access-memory ("SRAM") and ROM.

It is a principal object of the present invention to provide a structure for packaging a large number of flash EEPROM integrated circuit chips within such a PC card or other standard structure, thereby providing a large memory capacity in an individual card or other industry standard physical configuration.

It is another object of the present invention to provide a complete flash EEPROM system within such an individual card or other standard configuration that emulates a floppy or hard disk system.

It is a further object of the present invention to provide such a PC card structure that is easy to fabricate and test during assembly.

It is yet another object of the present invention to provide an improved computer memory system that utilizes one or more PC cards containing EEPROM integrated circuit chips.

SUMMARY OF THE INVENTION

This and additional objects are accomplished by the various aspects of the present invention, wherein, briefly and generally, according to one aspect, one or more EEPROM memory chips are directly mounted to a substrate to form a sub-board structure, and one or more of the sub-board structures are then attached to both sides of a main circuit board that extends throughout an interior of the card package and terminates along one side to form the PC card connector. Each of the sub-boards has a line of electrical terminals along one side thereof in a pattern that matches a pattern of exposed conductors on the main board.

In specific implementations, two, three or four such memory chips are provided in a row along a rectangularly shaped sub-board having terminals along one of its long dimensions and which is attached to the main board through connection of its terminals with the exposed main board contacts. Several such sub-boards can be installed on the main board, on one or both sides, within the limits of the PC card standard identified above. This sub-board structure permits a large number of EEPROM chips to be included within such a card. It also allows testing of the chips attached to each sub-board before they are assembled together on the main board, thus allowing an early identification of any problems in the mounting and initial interconnection of the circuit chips.

One type of EEPROM PC card contains only EEPROM memory chips, with the use of sub-boards as discussed above or otherwise, which are then interconnected through the card socket to a controller circuit. The controller interfaces between a computer system's main bus and the individual circuit chips. One, two or more sockets may be provided in conjunction with a given controller for respectively removably receiving one, two or more PC cards at a time. An amount of permanent EEPROM capacity may optionally be serviced by the same controller circuit.

Another type of flash EEPROM PC card contains a large number of individual memory circuit chips, either in the sub-board structure described above or otherwise, plus one or more circuit chips forming a controller. In this embodiment, each PC card communicates through its connector in a format of a computer system bus. Such a PC card is self-contained and no intervening controller circuit is required.

According to another aspect of the present invention, a flash EEPROM system is provided with physical form factors which match those of industry standard floppy and hard disk drives, along with an electrical interface that emulates such drives. Such a non-volatile flash EEPROM system is then easily usable as an alternative in a computer system designed to include such disk drives.

According to yet another aspect of the present invention, a flash EEPROM system is provided in a PC card or other industry standard memory system package with a controller for directly interfacing the system with a computer system bus. No extra adaptation is required to use such a non-volatile, non-mechanical mass memory in computer systems whose hardware and software operating systems are designed to accept and use disk systems. The internal controller converts the computer bus interface and signal protocols to those required to operate the flash EEPROM memory.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIG. 1 is an exploded view of first embodiment of a controller card having multiple sockets adapted to receive multiple PC cards and be connected to a host computer system bus;

FIG. 2 is a side view of the memory system of FIG. 1 with the PC cards and a connector in place;

FIG. 3 illustrates generally, in block diagram form, the electrical connections of the memory system of FIGS. 1 and 2;

FIG. 4 is an exploded view of an internal construction of a PC card showing the use of a main circuit board carrying sub-boards that each have several integrated circuit memory chips attached to them;

FIG. 5 is a sectional view of a PC card using the board structure of FIG. 4, taken at section 5—5 of FIGS. 1 and 4;

FIGS. 6 and 7 are sectional views of a sub-board in the assembly of FIGS. 4 and 5, taken respectively at sections 6—6 and 7—7 of FIG. 4;

FIG. 8 is a sectional view of a PC card showing a modification of FIG. 5 wherein a controller sub-board is included;

FIG. 9 illustrates, in an electrical block diagram form, a memory system utilizing two or more PC cards having a controller included within them in accordance with the structure of FIG. 8;

FIG. 10 is a side view of a second embodiment of a controller card having a socket adapted to receive a PC memory card, and also including fixed memory;

FIG. 11 is an end view of the controller card of FIG. 10;

FIG. 12 shows an electronic block diagram of a computer system in which a PC card containing flash EEPROM memory and its controller is used;

FIGS. 13A and 13B together form a schematic block diagram showing the electronic system within a PC card shown in the system of FIG. 12;

FIG. 14 illustrates a technique of addressing the flash EEPROM memory within the PC card system of FIGS. 13A and 13B;

FIG. 15 outlines a sector organization of the flash EEPROM integrated circuit memory cells;

FIG. 16 shows expanded detail of a portion of FIG. 13A; and

FIG. 17 is a flow diagram which shows an operation of the system of FIGS. 13A and 13B.

DESCRIPTION OF THE PREFERRED EMBODIMENTS

Several physical configurations of a memory card system are described with respect to FIGS. 1–11. An example electronic system within such a card, including both flash EEPROM and controller integrated circuit chips, is described with respect to FIGS. 12–17.

Physical Memory Card Configurations

Referring initially to FIGS. 1–3, one embodiment of a PC card flash EEPROM memory is illustrated. A structurally rigid printed circuit board 11 contains on one side various circuit components 13 that form a memory controller. The controller circuit is operably connected with a row of connector pins 15 attached to the board 11. A connector 17, provided at an end of a ribbon cable 19, is adapted to interconnect the conductors of the cable 19 to the row of pins 15. Another end (not shown) of the ribbon cable 19 is connectable with a microcomputer system bus. Alternatively, the controller board 11 could be provided with a different type of connector that is adapted to fit directly into an expansion slot of a microcomputer system.

On an opposite side of the controller board 11 from the controller circuit chips 13 are two PC card receiving slots 21 and 23. These slots have respective rows 25 and 27 of conductor pins. The slot and pin arrangement is dimensioned to receive respective PC cards 29 and 31 for mechanical and electrical interconnection therewith. The rows of pins 25 and 27 are connected to the controller circuit 13. The PC cards 29 and 31 contain a plurality of flash EEPROM memory chips, a preferred arrangement thereof being discussed in detail below. The PC cards 29 and 31 conform to the PC Card Standard identified above, which is incorporated herein by this reference. Of course, other sized cards may be used instead, depending upon the particular application.

Although two sockets 21 and 23 are indicated in FIGS. 1–3, this embodiment may be varied to contain only one socket or to include three or more sockets. As FIG. 2 shows, both of the PC cards 29 and 31 can be inserted and electrically interconnected with the controller 13 at one time. If additional sockets are provided, additional cards can similarly be simultaneously utilized. The removability of the memory cards allows them to be used much like floppy disks are currently used. As indicated in FIG. 3, additional flash EEPROM memory 33 can be provided on the underside of the controller board 11 itself as fixed memory. An example of a controller card having an amount of fixed memory is given in another embodiment shown in FIGS. 10 and 11.

FIGS. 4 and 5 illustrate a preferred printed circuit board structure for mounting and interconnecting a plurality of individual flash EEPROM integrated circuit chips (up to 24 in this example). A main rectangularly-shaped printed circuit board 35 has outside dimensions slightly smaller than those of the outside of the PC card in which it is installed. A plurality of sub-boards 37–42 are attached to opposite surfaces of the main board 35 (in this case, six). Each of the sub-boards contains four integrated circuit EEPROM chips attached to a surface thereof opposite to that facing the main board 35. Two such chips 43 and 45 are shown in FIG. 4 in conjunction with the sub-board 37. similarly, circuit chips 47–50 are indicated to be attached to a surface of the sub-board 40. Illustration of the remaining circuit chips is omitted for clarity.

The main board 37 includes a center (core) supporting substrate with conductor traces formed on either side. A thin dielectric layer is coated over the entire area of each of the surfaces, covering the conductor traces and any exposed portions of the core substrate material surfaces. The insulating material does not cover, however, various rows of electrical contacts.

One such row of electrical contacts 51, and a similar row on an opposite side of the main board 35 but not visible in FIG. 4, is provided across a narrow side of the main board 35 and forms the contacts for the rows of pins 21 and 23 of FIG. 1. Traces beneath the insulation layer (not shown) then interconnect these edge contacts with various rows of contacts across both surfaces for interconnecting with the sub-boards, for example, a row 53 of contacts provided across the narrow width of the main board 35. A row of contacts 55 having the same spacing and pattern as the row 53 is provided along a large edge of the rectangularly shaped sub-board 37. Thus, when the sub-board 37 is positioned on a surface of the main board 35, its contacts 55 line up with the row 53 of contacts. They are attached to one another by soldering, or some other technique. Indeed, in most cases, the soldering of these contacts is the only form of mechanical attachment of the sub-board to the main board that is required. This makes the structure quite simple and expedient to assemble. However, if additional attachment is believed necessary, a dot of epoxy can be applied between each sub-board and the main board along a side of the sub-board opposite to its row of edge contacts.

Similarly, five other rows of contacts are provided for accommodating the other five sub-boards shown in the example of FIGS. 4 and 5. Rows 57 and 59 are on the same side of the main board 35 as the row 53. All rows on the main board 37 are parallel to each other and to the short edge of the board 35. Similar rows of contacts 61, 63 and 65 are shown in dotted outline on the opposite surface of the main board 35. Most of the conductive traces are preferably provided on one side of the core substrate of the main board 35, these conductors then penetrating that sub-board to connect with the contacts on an opposite side.

Referring to the cross-sectional PC card view of FIG. 5, each of the sub-boards is shown physically attached to the main board 35 only by its electrical contacts. In either case, a plastic ring 67 surrounds its outside edges and forms the narrow sidewalls of the resulting PC card. Rows of holes 69 and 71 are provided at one end to accept socket pins, such as the pins 25 of FIG. 1, for contact with the edge connector of the main board 35, which includes the row 51 of contacts. Generally rectangularly shaped, thin metal plates 73 and 75 are attached to the edge ring 67 to form opposite sides of the PC card. Metal layers are preferred in order to provide highly desirable radio frequency shielding. The outside layers 73 and 75 are generally connected with ground potential of the memory circuit carried therein, usually $V_{ss}$ of the computer system with which it is interconnected.

With reference to FIGS. 4, 6 and 7, the structure of the sub-boards and attachment of the memory chips to them will now be described. Taking sub-board 37 and its attached chip 45 as an example, the chip is provided with its interconnecting pads 77 supplied along only one of the chip edges. This edge of each of the chips attached to the sub-board 37 is then positioned to face the edge carrying the sub-board contacts 55.

The sub-boards are best illustrated by the sectional views of FIGS. 6 and 7. A central core substrate layer 79 carries conductive traces on both sides. For example, in the view of FIG. 6, a conductive trace 81 is attached to the top side of the central substrate layer 79 and in the sectional view of FIG. 7, taken at a different position, a trace 83 is so provided. The traces on the top side of the core substrate layer 79 generally extend across the narrow width of the sub-board 37 while conductive traces on the bottom side, such as traces 85, 87 and 89, generally extend in the long direction of the sub-board. The result is a type of matrix that makes it easy to interconnect the large number of contacts provided by multiple integrated circuit chips and the sub-board contacts 55. An electrical contact is made through the layer 79 when it is desired to interconnect traces on opposite sides thereof, such as top trace 81 being connected with bottom trace 89 in the view of FIG. 6, and top trace 83 being interconnected with bottom trace 87 in the view of FIG. 7. Both sides of the substrate are covered with respective thin insulating layers 91 and 93.

Portions of the top side traces along the contact edge of the sub-board are exposed, however, for wire bonding to pads of the chips attached to them. For example, in the section of FIG. 6, a wire 95 is bonded between one pad of the chip 45 and the trace 81. In the section of FIG. 7, another wire 97 is bonded between a different pad of the chip 45 and an electrically separate trace 83. In the example section of FIG. 6, the trace 81 is connected with an edge contact 99, one of those in the row of sub-board contacts 55. The wire 95 is then connected directly to the pin 99 a very short distance away. Others of the chips on the sub-board 37 are similarly interconnected with the pin 99 by bonding to top traces which are interconnected with the bottom trace 89 that has been connected to the pin 99.

The section of FIG. 7 shows a different example, wherein the wire 97 is bonded to a top conductive trace 83 that is connected to a bottom trace 87. Although not shown, the bottom trace 87 is connected somehow to one of the conductors of the sub-board row of contacts 55. In the case of FIG. 7, a pin 101 is interconnected on the bottom of the central substrate 79 with the trace 85. That bottom trace then allows a pad, not shown, of the chip 45 to be electrically connected with it, and similarly for the other chips attached to the sub-board 37.

Surrounding the attached integrated circuit chips on a top side of the sub-board 37 is a plastic frame 103. That frame, in combination with an overall encapsulation (not shown) of the chips on the top surface of the sub-boards, protects those chips.

Referring to FIGS. 8 and 9, a modification of the embodiment of FIGS. 4–7 is shown with common elements indicated by the same reference number but with a prime (') added. In this case, a sub-board 105 nearest the edge connector contains integrated circuit chips forming a controller. That is, one sub-board of memory chips is replaced with an on-board controller so that the resulting PC card can be operated directly from a computer system bus without having to use the external controller 13 of the embodiment of FIGS. 1–3. Most of the traces interconnecting the edge connector of the main board 35' are connected directly with rows of main board contacts to which the controller sub-board 105 is electrically connected. Traces interconnecting the rows of contacts with which primary chip containing sub-boards are primarily attached also extend to contacts with which the controller sub-board 105 is connected. Indeed, depending upon the design, enough controller sub-board contacts may be required as to have rows along each of the opposing long sides of the sub-boards, as shown in FIG. 8, with corresponding parallel rows of contacts on the top surface of the main board 37'. Alternative to mounting the controller chips on a sub-board, they can be mounted directly onto the main board 35 in the space shown in FIG. 8 to be occupied by the sub-board 105.

Referring to FIG. 9, a system utilizing such a card with internal controller is illustrated. Two such cards 107 and 109 are shown to be connectable through a connector 111 to a microcomputer system bus through conductors 19'. Of course, any number of such cards, from 1 to many, can be utilized in a single computer system having one or more such connectors. The connector 111 need not contain any electronic components, except perhaps for buffers, amplifiers and the like. But no data manipulation or other controller functions need be provided outside of the cards 107 and 109, in this embodiment. Of course, more than two such PC cards can be utilized at a time by providing an expanded connector 111.

Referring to FIGS. 10 and 11, a modification of the controller card illustrated in FIGS. 1 and 2 is shown in orthogonal side and end views, respectively. A structurally rigid printed circuit board 121 is provided with a single socket 123 for removably receiving a PC memory card 125 of the type discussed with respect to FIGS. 4–7 above. The printed circuit board 121 is wide enough in this embodiment to accept a plurality of packaged integrated circuit chips 127 that form the memory controller. A connector 129 along one edge of the board 121 provides for connection to the computer system through a ribbon cable or the like. Attached under the board 121 are a plurality of sub-boards 130, in this case, six, of the type described earlier with respect to FIGS. 6 and 7. Each sub-board contains a plurality of flash EEPROM chips. The sub-boards are connected to exposed contacts on the underside of the controller board 121 in the same manner as utilized in the PC cards as described with respect to FIG. 5.

The controller board embodiment of FIGS. 10 and 11 provides a combination of fixed system flash EEPROM capacity, attached to the underside of the board 121, and the ability to use removable PC cards also containing flash EEPROM chips. The controller formed by interconnecting through traces on the controller board 121 the packaged circuits 127 is connected with the computer system bus connector 129 and operates both the fixed and removable EEPROM memory. Of course, one or more additional sockets may be provided in order to accommodate multiple PC memory cards at one time.

In addition to packaging the flash memory within the industry standard PC memory card form factor discussed above, it is also desirable to be able to package such a memory system within an industry standard floppy disk drive or hard disk drive form factor. This allows the semiconductor memory to be easily physically substituted for a disk drive. An example standard, just being formed, is for a 1.8 inch hard disk drive with a small form factor. Its dimensions are about 19 mm. in height, 54 mm. in width, and 73 mm. in length, as a maximum. As disk drives evolve over time, their packages become smaller. The packaging techniques described above, particularly the use of sub-boards for mounting circuit chips, allow large solid state memory systems to be presented in the same small packages.

Electronic EEPROM and Controller System within a Package

It is preferred that the memory system included in a card or other standard package be self-sufficient so that it can electronically interface at its connector with a standard computer bus interface. One such standard is an integrated device electronics ("IDE") interface. This interface is being used extensively with hard disk drives that have controller circuits integrated as part of the drive. Thus, the packaged EEPROM system as part of the present invention includes controller circuits in order that the unit appears to the computer system as a disk drive.

Referring to the general block diagram of FIG. 12, bus interface circuits 137 are shown as providing individual circuit connections 138 according to the IDE interface specifications to a flash EEPROM memory package 139 that includes a controller circuit. The package 139 may be a thin PC card as discussed above with respect to the figures, a package having dimensions and capabilities similar to that of a hard disk drive, as mentioned previously, or various other convenient removable packages. The bus interface 137 is connected with a computer system bus 153. A typical computer system is shown in FIG. 12 to include a microprocessor 154, ROM 155, RAM 156 and input/output circuits 157, all connected with the common bus 153. Of course, the memory system of the present invention can be utilized with other specific computer systems.

The IDE signal lines 138 connected to the memory package 139 include, as indicated in FIG. 12, the 16-bit data bus D0–D15 and three lines of an address bus, A0–A2. These lines are connected to the corresponding lines of the system bus 153 through buffers and drivers within the interface circuit 137. Similarly provided are system control signals IOR, IOW and RESET. The signals IOR and IOW affect, respectively, a read or write operation within the memory package 139 when toggling between states.

The IDE signal lines 138 also include control lines CS1 and CS2, which serve as two of several address bit lines for the memory within the package 139. These signals are decoded from the higher level system address lines A3 and up by appropriate circuits within the bus interface circuitry 137. Alternatively, the necessary address lines may be communicated with the memory package 139 and this decoding circuitry provided within the package. However, this occupies more pins within the connector so is usually done in the manner being described.

A number of status signals are also provided by the memory within the package 139 to the computer system through the bus interface 137. An example is the signal identified as IOCS16 which notifies the system whether the memory module accepts an 8- or 16-bit transfer on the data bus. Another line INTRQ provides an interrupt request from the memory to the computer system. Of course, there are additional control and status signals, as well as voltage supply and ground lines, that are communicated over the connector according to the IDE standard.

FIGS. 13A and 13B illustrate a preferred form of the memory system 139, being substantial duplicates of FIGS. 7A and 2A, respectively, of the simultaneously filed application identified above. As described more completely in that application, a controller 133 includes a disk drive interface 411 that utilizes a commercially available peripheral interface chip 415 that is connected to the lines 138 which are, in turn, connected to the host computer system through mating connector portions. The peripheral interface 415 transfers data between the host computer and a memory controller 401 over a serial data link 421. A microprocessor 417 controls the peripheral interface 415 and memory controller 401 over an internal bus 423. An example of the peripheral interface circuit 415 is an SH 265 disk controller chip available from Cirrus Logic, Inc. An example of the microprocessor 417 is a Motorola, Inc. 68HC11 part. The buffer memory 413 is static RAM and provides temporary storage of data being transferred between the memory unit 123 and the host computer system. The memory controller 401 is described in detail in the aforementioned simultaneously filed application with respect to its FIG. 8A. It is desirable to combine as much of the interface 415 and the controller 401 onto a single integrated circuit chip.

The controller 133 of FIG. 13A is connected to at least one, and preferably a plurality, of memory modules 131 of the type illustrated in FIG. 13B. Each memory module 131 includes a plurality of EEPROM integrated circuit chips 141 physically connected together on a sub-board 143. Each of the memory chips is connected with the controller 133 over lines 135. Each of the memory chips 141 is programmed with a unique address by connection with a plurality of pads, such as the pads 147 on one of the devices, being controlled by selectively grounding them on mount 149.

Referring to FIG. 14, each of the EEPROM integrated circuits is formed on a small substrate chip with memory cells arranged in rows and columns in quadrants 201, 203, 205 and 207. These individual quadrant arrays are connected through interface circuits 209 to the controller lines 135 and a line 151. Each of the memory cells within a given quadrant, such as the quadrant 201, is addressable by proper voltages applied to intersecting column bit and row driver lines. A sector of such memory cells contiguously arranged, such as a sector 211 shown as part of the quadrant 201, is erasable simultaneously by addressing the sector.

Referring to FIG. 15, the sector 211 is shown to be formed of four rows 213 of memory cells, each row having a length 215 of enough cells to store 128 bytes. Thus, the sector 211 stores 512 bytes, the same capacity as a sector of disk storage according to prevailing disk standards. A number of such sectors are provided adjacent, to each other, each of which is separately addressable and erasable by a single command in one clock cycle. An additional byte 217 of disk storage is provided as an extension of each row of EEPROM cells of the sector 211 for the purpose of providing spare EEPROM cells to replace bad cells within the sector 211. Similarly, another byte 219 stores header and other common overhead information required for each sector. Additional details of the memory system operation can be had by reference to published international patent applications of the assignee hereof, namely European publication no. 392, 895, dated Oct. 17, 1990, and PCT publication no. WO 90/12400, dated Oct. 18, 1990.

The number of EEPROM cells, and thus the number of sectors, in each of the quadrants 201, 203, 205 and 207 (FIG. 14) is preferably made to be the same. A given sector of cells is addressed by first designating the integrated circuit chip, its quadrant and then the sector within the quadrant. The highest capacity memory unit is provided when all four quadrants are utilized, of course, but the quadrant approach allows memory units of lower storage capacity to be manufactured with rejected chips so long as at least one quadrant and the buffer portion 209 of a rejected chip are operable. This thus allows making use of memory chips that would otherwise be discarded, and thus the provision of a lower capacity memory unit at a much lower cost.

FIG. 14 additionally illustrates the manner in which the individual chip EEPROM integrated circuit chips 141 are addressed in order to read or write data in response to commands from the system computer. A box 221 indicates a translation of the information applied to the memory unit over the lines 138. The address from the host computer designates a disk drive head that is to be utilized for the data transfer, a data cylinder, a beginning sector number on that cylinder, and the number of contiguous sectors (sector count) in which the data is being read or written. The memory controller translates that address, as shown on the right hand side of block 221 of FIG. 14, into a chip number, the quadrant on the chip and a sector of memory cells within that quadrant that is to be addressed. If more than one sector of data is being transferred during a single access by the host computer, a number of EEPROM sector accesses equal to the disk sector count is accomplished.

The circuitry for accomplishing this address translation is illustrated in FIG. 16, a part of the controller 133 of FIG. 13A. The commercially available peripheral interface chip 415 includes a number of registers which are utilized to perform the translation. One group of registers which responds to a toggle of the IOR signal includes a status register 223, a read head address register 225, read cylinder address registers 227 and 229 (allows a 16-bit cylinder address), a read starting sector address register 231, and a read sector count register 233. Similarly, another set of registers is written into or read by toggling the IOW signal. These registers include a command register 235, a write head address register 237, write cylinder address registers 239 and 241, a write starting sector address register 243, and a write sector count register 245. Each pair of registers is addressable by the host computer with a bit pattern indicated to the right of the registers of FIG. 16, involving the signals CS1, CS0 and A0–A2. Similarly, a read buffer memory 247 and a write buffer memory 249 are separately addressable.

The group of registers provide a temporary place for storing commands from the host computer over the interface lines 138. When the computer system wants to perform a read or write operation, it writes a READ or WRITE command into the command register 235 after writing into the respective sets of registers 225–233 or 237–245 the address, in disk drive terms, of the sectors where the data is to be read or written. This is controlled by the basic input/output system ("BIOS") that is part of the computer operating system. The microprocessor 417, through a microprocessor port 251, then reads the command from the command register 235 and the address from the appropriate read or write registers, and performs the translation and command. Once a command is detected in the register 235, a BUSY signal is written into the status register 223 that the host computer can then read to know that the memory system is in the process of executing a command and cannot receive another. Data is transferred between the buffer memory 413 and the EEPROM memory through a data port 253. Once a commanded operation has been performed, the microprocessor 417 then writes a NOT BUSY indication in the status register 223. Other registers are provided in the commercially available peripheral interface chips, but those of them which are most important to the operation being described herein have been shown.

This operation under control of the microprocessor 417 (FIG. 13A) is illustrated in a general way by a flow diagram of FIG. 17. A first step in the operation is for the command register 235 to be continuously polled in order to detect a command placed there by the host computer system. Such a read operation is indicated by a block 261 and a determination as to whether a new command has been written into the register 235 or not is indicated by a block 263. If a new command has not been so written since that register was last accessed, then the steps 261 and 263 are repeated. When a new command is detected, the processing moves to a step 265 where a BUSY status signal is written in the register 223. The host computer, in polling the status register 223, will then not lead another command into the command register 235 until a NOT BUSY status is written into the register 223 at the end of the current operation.

Other than READ and WRITE, other commands from the host processor include SEEK and RESTORE. These are commands that are intended to move a disk drive read/write head inbetween read and write operations for optimal positioning. If one of these commands is detected, as indicated by a block 267, a majority of the processing is skipped, proceeding immediately to the writing of the NOT BUSY status in-the register 223, as indicated by a block 269.

If the command is to READ data from the EEPROM system, or to WRITE data into it, as indicated by a block 271, then one of two paths is taken in the processing. If a READ operation is commanded, a step 273 reads the address, in disk drive terms, stored in the registers 225–223 by the host computer. A next step 275 translates that disk address into a flash memory address, as generally described in FIG. 14 with reference to an address translation block 221. This translation is most easily accomplished by an algorithm calculation or reference to a look up table that have a one-to-one correspondence between the disk address and the EEPROM address. That one-to-one correspondence is disturbed, of course, when a sector is found to have so many bad EEPROM cells that it must be taken out of service and replaced by another sector. The address translation table is then dynamically altered.

After the address has been translated into EEPROM terms, a next step 276 reads data from the flash memory and writes it into the read buffer 247.

Thereafter, in a step 277, the read data is compared with an expanded form of an error correction code ("ECC") that has been stored with the data. A common ECC format and algorithm used for disk drives is used. Next, in a step 278, the read data is transferred to the host computer. Any error that has been detected during the reading process is written into the status register 223, in a step 279. Following that, the step 269 indicates to the host computer that the operation is complete by writing NOT BUSY into the register 223. At that time, the system computer will know that the read operation is complete and that it may access the buffer read memory 247 over the interconnection lines 138 to transfer the read data to somewhere else in the computer system.

Returning to the decision block 271, the path for a WRITE command is similar to that just described for a READ command. A first step 281 in response to such a command is to read the address from registers 237–245, which have been written there by the host computer in disk drive terms. A next step 283 translates that address into EEPROM terms, in the same way described with respect to the step 275. A final step 285 is to execute the command by reading data which has been placed into the write buffer memory 249 by the host computer system and then writing that data into the address EEPROM sectors. After that is complete, the steps 279 and 269 are executed in the manner discussed above. The process then returns to the beginning steps 261 and 263 to poll the command register 235 for a new command from the host computer system.

Although the various aspects of the present invention have been described with respect to their preferred embodiments, it will be understood that the invention is entitled to protection within the full scope of the appended claims.

It is claimed:

1. In an enclosed rectangularly shaped computer memory system that is less than 5.5 centimeters in width, less than 9.0 centimeters in length and less than 6.0 millimeters in thickness, and having an electrical connector along one side thereof, a combination comprising a plurality of substantially identical flash EEPROM integrated circuit chips, and a controller circuit interconnected between said electrical connector and said plurality of flash EEPROM integrated circuit chips.

2. The combination of claim 1 wherein said controller circuit includes means receiving from said connector a disk memory address in the form of head, cylinder, beginning sector and sector count designations for addressing corresponding memory locations within said flash EEPROM integrated circuit chips.

3. The combination of claim 2 wherein said plurality of flash EEPROM chips are each characterized by its storage capacity being divided into physical quadrants and each quadrant having a plurality of separately addressable sectors of memory cells, wherein a chip sector includes at least a number of cells equal to a number of bits in the disk sector, and further wherein said means receiving from said connector a disk memory address addresses the chips by designating an individual chip, its quadrant and a sector within that quadrant that corresponds with a disk sector address received from the connector.

4. The combination of claim 1 wherein said controller is characterized by interfacing through said connector with an industry standard IDE interface in order to translate signals received from a computer system bus according to that standard into signals that communicate with said plurality of EEPROM circuit chips.

5. In an enclosed package having an electrical connector carried thereby for interfacing with computer system signals that address disk memory by head number, cylinder number, and specific ones of a plurality of sectors that each contain a predetermined number of bytes, a mass storage system, comprising:

a plurality of flash EEPROM integrated circuit chips containing a large number of non-volatile memory cells arranged in physical quadrants on the chips and having separately addressable sectors of cells within the quadrants, the individual sectors having enough cells to store said predetermined number of bytes, and a controller connected between said connector and said plurality of flash EEPROM integrated circuit chips in a manner to allow data to be written into said chips and to be read from said chips when a computer system is connected with said connector, said controller including means responsive to said computer system signals that address disk memory for addressing said plurality of EEPROM chips by corresponding chip numbers, quadrants and numbers of sectors, whereby the package of integrated circuit memory is addressed by a computer system as is disk storage memory.

6. The mass storage system according to claim 5 wherein said package is substantially rectangular in shape with a width of about 5.5 centimeters or less, a length of about 9.0 centimeters or less and a thickness of about 19 millimeters or less, and further wherein said electrical connector is mounted along one side thereof.

7. The mass storage system according to claim 5 wherein said package is a rectangularly shaped PC memory card with a width less than 5.5 centimeters,. a length less than 9.0 centimeters and a thickness of less than 6.0 millimeters, and further wherein said electrical connector is mounted along one side thereof.

8. The mass storage system according to claim 5 wherein said package has a width of about 5.4 centimeters, a length of about 7.3 centimeters and a thickness of about 19 millimeters or less, whereby said mass storage system is provided in a package that is substantially the same as an industry standard for a 1.8 inch hard disk drive.

9. The mass storage system according to claim 5 wherein said predetermined number of bytes is substantially 512.

10. The mass storage system according to claim 5 wherein said controller includes a plurality of temporary storage registers, a buffer data memory and a microprocessor, the registers and buffer memory being connected to be accessible both by a computer system through said connector and by said controller microprocessor, said microprocessor characterized by responding to a command written into one of said registers by an external computer system through the connector to carry out the command and thereafter writing into another one of said registers a status after the command has been executed.

11. The mass storage system according to claim 10 wherein said microprocessor is characterized by reading disk head, disk cylinder and disk sector addresses from others of said registers in response to a READ or a WRITE command in said one register, determining a corresponding address within the EEPROM chips, and then writing a completion status into said another one of said registers after data is read from or written into the EEPROM chip memory.

12. The mass storage system according to claim 11 wherein said microprocessor is additionally characterized by responding to a SEEK or a RESTORE command in said one register to immediately write a completion status into said another one of said registers.

13. In an enclosed rectangularly shaped computer memory system that is less than 5.5 centimeters in width, less than 9.0 centimeters in length and less than 6.0 millimeters in thickness, and having an electrical connector along one side thereof, a combination comprising a plurality of substantially identical flash EEPROM integrated circuit chips, and a controller circuit interconnected between said electrical connector and said plurality of flash EEPROM integrated circuit chips, wherein the transfer of data between said electrical connector and said plurality of flash EEPROM integrated circuit chips includes a serial transfer portion.

14. The combination of claim 13 wherein said controller circuit includes means receiving from said connector a disk memory address in the form of head, cylinder, beginning sector and sector count designations for addressing corresponding memory locations within said flash EEPROM integrated circuit chips.

15. The combination of claim 14 wherein said plurality of flash EEPROM chips are each characterized by its storage capacity being divided into physical quadrants and each quadrant having a plurality of separately addressable sectors of memory cells, wherein a chip sector includes at least a number of cells equal to a number of bits in the disk sector, and further wherein an EEPROM addressing means addresses the chips by designating an individual chip, its quadrant and a sector within that quadrant that corresponds with a disk sector address received from the connector.

16. The combination of claim 13 wherein said controller is characterized by interfacing through said connector with an industry standard IDE interface in order to translate signals received from a computer system bus according to that standard into signals that communicate with said plurality of EEPROM circuit chips.

17. In an enclosed package having an electrical connector carried thereby for interfacing with computer system signals including computer address signals that address disk memory by head number, cylinder number, and specific ones of a plurality of sectors that each contain a predetermined number of bytes, a mass storage system, comprising:

a plurality of flash EEPROM integrated circuit chips containing a large number of non-volatile memory cells arranged in physical quadrants on the chips and having separately addressable sectors of cells within the quadrants, the individual sectors having enough cells to store said predetermined number of bytes, and a controller connected between said connector and said plurality of flash EEPROM integrated circuit chips in a manner to allow data to be written into said chips and to be read from said chips when a computer system is connected with said connector, said controller including means responsive to said computer address signals for addressing said plurality of EEPROM chips by corresponding chip numbers, quadrants and numbers of sectors, whereby the package of integrated circuit memory is addressed by a computer system as is disk storage memory, wherein the transfer of said data between said computer system and said plurality of EEPROM chips includes a serial transfer portion.

18. A The mass storage system according to claim 17 wherein said package is substantially rectangular in shape with a width of about 5.5 centimeters or less, a length of about 9.0 centimeters or less and a thickness of about 19 millimeters or less, and further wherein said electrical connector is mounted along one side thereof.

19. The mass storage system according to claim 17 wherein said package is a rectangularly shaped PC memory card with a width less than 5.5 centimeters,. a length less than 9.0 centimeters and a thickness of less than 6.0 millimeters, and further wherein said electrical connector is mounted along one side thereof.

20. The mass storage system according to claim 17 wherein said package has a width of about 5.4 centimeters, a length of about 7.3 centimeters and a thickness of about 19 millimeters or less, whereby said mass storage system is provided in a package that is substantially the same as an industry standard for a 1.8 inch hard disk drive.

21. The mass storage system according to claim 17 wherein said predetermined number of bytes is substantially 512.

22. The mass storage system according to claim 17 wherein said controller includes a plurality of temporary storage registers, a buffer data memory and a microprocessor, the registers and buffer memory being connected to be accessible both by a computer system through said connector and by said controller microprocessor, said microprocessor characterized by responding to a command written into one of said registers by an external computer system through the connector to carry out the command and thereafter writing into another one of said registers a status after the command has been executed.

23. The mass storage system according to claim 22 wherein said microprocessor is characterized by reading disk head, disk cylinder and disk sector addresses from others of said registers in response to a READ or a WRITE command in said one register, determining a corresponding address within the EEPROM chips, and then writing a completion status into said another one of said registers after data is read from or written into the EEPROM chip memory.

24. The mass storage system according to claim 23 wherein said microprocessor is additionally characterized by responding to a SEEK or a RESTORE command in said one register to immediately write a completion status into said another one of said registers.

* * * * *